US008947276B1

(12) United States Patent
Yu et al.

(10) Patent No.: US 8,947,276 B1
(45) Date of Patent: Feb. 3, 2015

(54) SYSTEM AND METHODOLOGY FOR ANALOG-TO-DIGITAL CONVERTER LINEARITY TESTING

(71) Applicants: Zhongjun Yu, Ames, IA (US); Degang Chen, Ames, IA (US)

(72) Inventors: Zhongjun Yu, Ames, IA (US); Degang Chen, Ames, IA (US)

( * ) Notice: Subject to any disclaimer, the term of this patent is extended or adjusted under 35 U.S.C. 154(b) by 0 days.

(21) Appl. No.: 14/246,614

(22) Filed: Apr. 7, 2014

Related U.S. Application Data

(60) Provisional application No. 61/808,667, filed on Apr. 5, 2013.

(51) Int. Cl.
H03M 1/00 (2006.01)
H03M 1/10 (2006.01)

(52) U.S. Cl.
CPC .................. H03M 1/1071 (2013.01)
USPC ............................ 341/120; 341/118; 341/155

(58) Field of Classification Search
CPC ......... H03M 1/109; H03M 1/66; H03M 1/00; H03M 1/1071; H03M 1/12
USPC .......................... 341/118, 119, 120, 155, 156
See application file for complete search history.

(56) References Cited

U.S. PATENT DOCUMENTS

| | | | | |
|---|---|---|---|---|
| 6,516,290 B1 * | 2/2003 | Peng | ............................. | 702/198 |
| 6,999,013 B1 * | 2/2006 | Roo et al. | ....................... | 341/138 |
| 7,142,137 B2 * | 11/2006 | Batruni | ......................... | 341/118 |
| 7,394,413 B2 * | 7/2008 | Batruni | ......................... | 341/118 |
| 7,522,077 B1 * | 4/2009 | Itkin | ............................. | 341/120 |
| 7,969,335 B2 * | 6/2011 | Arias et al. | .................... | 341/120 |
| 8,049,650 B2 * | 11/2011 | Lin et al. | ....................... | 341/120 |
| 2005/0219088 A1 * | 10/2005 | Batruni | ......................... | 341/118 |
| 2007/0030189 A1 * | 2/2007 | Batruni | ......................... | 341/118 |

* cited by examiner

Primary Examiner — Jean B Jeanglaude
(74) Attorney, Agent, or Firm — Tyson B. Benson; Advent, LLP

(57) ABSTRACT

A method for testing an analog-to-digital converter is disclosed. In an implementation, the method may include providing input data to analog-to-digital converter circuitry. The analog-to-digital converter circuitry generates an output code based upon the input data. The method includes generating expected output code based upon the corresponding input data and generating an output code error signal based upon the difference of the output code and the expected output code. A predicted code error signal is modeled based upon corresponding code. The method also includes generating a noise error signal representing a difference between the output code error signal and the predicted code error.

8 Claims, 3 Drawing Sheets

SYSTEM AND METHODOLOGY FOR ANALOG-TO-DIGITAL CONVERTER LINEARITY TESTING

CROSS-REFERENCE TO RELATED APPLICATIONS

The present application claims the benefit under 35 U.S.C. §119(e) of U.S. Provisional Application Ser. No. 61/808,667, entitled SYSTEM FOR ANALOG-TO-DIGITAL CONVERTER LINEARITY TESTING, filed on Apr. 5, 2013. U.S. Provisional Application Ser. No. 61/808,667 is herein incorporated by reference in its entirety.

BACKGROUND

Precision testing of high-resolution analog-to-digital converters (ADCs) can be very time consuming and very costly. For example, complete testing of all codes of a 16-bit ADC with the current state of the art ADC test methods will require $2^{16}$ (e.g., 65,536) accurate measurements of discrete analog voltage levels (called transition voltages or transition points of the ADC) to completely test the integral nonlinearity (INL) and differential nonlinearity (DNL) of the ADC. In ADC characterization or post-silicon validation, this test needs to be repeated many times at multiple temperatures, at multiple supply voltages, and at multiple other environmental or control conditions. The overall linearity test of an ADC using the state of the art methods can take as long as several days, to several weeks, to even several months. This leads to long engineering cost and long time-to-market. In production test, a single linearity test of a 16 bit ADC can take several seconds to tens of seconds. Testing of higher resolution ADCs would take significantly longer times, with each extra bit requiring two (2), three (3), or four (4) times extra time during the doubling of the number of transition voltages and slower sampling rate. With each second costing about a nickel in production test, test cost of high resolution ADCs becomes expensive using state of the art methodology.

SUMMARY

A system and methodology for analog-to-digital converter linearity testing is disclosed. In an implementation, the system may include a signal generator and analog-to-digital converter circuitry under test. The analog-to-digital converter circuitry under test generates an output code based upon an input signal from the signal generator. The system includes an expected signal generator module connected to the signal generator and to the analog-to-digital converter circuitry. The expected signal generator module generates an expected output code based upon the analog input signal. The system also includes an output code error signal module connected to the output of the analog-to-digital converter circuitry and to the output of the expected signal generator module. The error signal module generates an output code error signal representing a difference between the ADC output code and corresponding expected output code. The system also includes a nonlinearity modeling module connected to the output code error signal module. The nonlinearity module models a predicted ADC nonlinearity error value based upon the output code. The system also includes a nonlinearity model error signal module connected to the error signal module and the nonlinearity modeling module. The nonlinearity model error signal module for generating a nonlinearity model error value representing a difference between the ADC output code error signal and the corresponding predicted ADC nonlinearity error value.

A method for testing an analog-to-digital converter is disclosed. In an implementation, the method may include providing input data to analog-to-digital converter circuitry. The input data may comprise a discrete input voltage level, a collection of a multitude of discrete input voltage levels, or a continuous input voltage waveform. The waveform may be a linear ramp, or a sine wave, or another known form. The collection of discrete voltage levels may be samples taken from such a waveform. The analog-to-digital converter circuitry generates output data, and the output data may be an output code or a collection of output codes based upon the input data. The method includes generating expected output data. The expected output data may be an expected code or a collection of expected output codes based upon the corresponding input data. The method also includes generating an output code error signal based upon the difference of the output data and the expected output data. A predicted ADC nonlinearity error signal is modeled based upon corresponding output data. The method also includes generating a nonlinearity model error signal representing a difference between the ADC output code error signal and the predicted ADC nonlinearity error at the corresponding ADC output codes. The method also includes adapting the ADC nonlinearity model based upon the output code error signal to minimize the nonlinearity model error signal. The method includes computing the ADC's integral nonlinearity (INL) and differential nonlinearity (DNL) at respective ADC output codes based upon the ADC nonlinearity model after being optimized through adaptation and model error minimization.

This Summary is provided to introduce a selection of concepts in a simplified form that are further described below in the Written Description. This Summary is not intended to identify key features or essential features of the claimed subject matter, nor is it intended to be used as an aid in determining the scope of the claimed subject matter.

BRIEF DESCRIPTION OF THE FIGURES

The Written Description is described with reference to the accompanying figures. The use of the same reference numbers in different instances in the description and the figures may indicate similar or identical items.

WRITTEN DESCRIPTION

A system is disclosed to provide linearity testing to an analog-to-digital (ADC) converter. Two groups of specifications typically impose testing challenges before a product including the analog-to-digital converter can be passed to the customer. One group relates to the ADC's transfer curve, which includes integral nonlinearity (INL), differential nonlinearity (DNL), offset, and gain error. The other group relates to the ADC's spectral performance, which includes total harmonic distortion (THD), spurious free dynamic range (SFDR), signal to noise ratio (SNR) and so forth. Typically, linearity tests have been tested utilizing conventional histogram methods that represent the state of the art in ADC testing. However, the present disclosure may achieve sufficient test accuracy, enhance measurement precision, and reduce test time and test cost.

Figure 1:
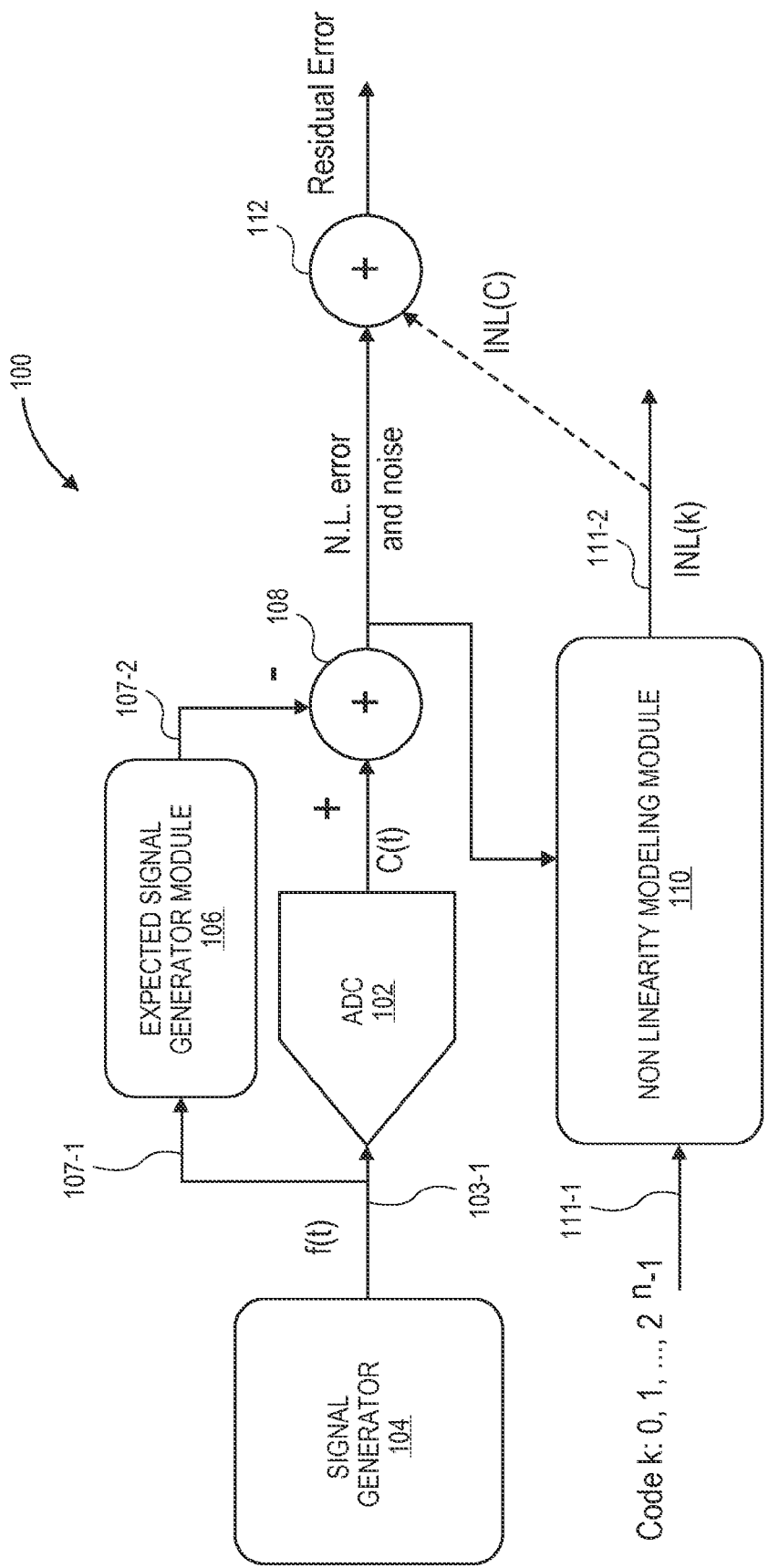
FIG. 1 is a block diagram of a testing system in accordance with an example embodiment of the present disclosure.

FIG. 1 illustrates an example system 100 for testing, such as linearity testing, analog-to-digital converter circuitry 102. As shown, the system 100 includes analog-to-digital converter circuitry 102, a signal generator 104, an expected signal generator module 106, an error signal module 108 and a nonlinearity modeling module 110. In one or more implementations, the analog-to-digital converter circuitry 102 comprises circuitry for converting analog signals to corresponding digital signals. For example, the analog-to-digital converter circuitry 102 generates an output code representing a digital output based upon the input signal. For example, the analog-to-digital converter circuitry 102 generates an output code C(t) (e.g., a digital code) corresponding to the input signal f(t). The analog-to-digital converter circuitry 102 includes an input 103-1 and an output 103-2.

As shown in FIG. 1, a signal generator 104 is electrically connected to the analog-to-digital converter circuitry 102. The signal generator 104 generates an accurate input signal (e.g., accurate analog input) for inputting to the analog-to-digital converter circuitry 102. The input signals may comprise a sine wave signal, a linear ramp signal, or the like. In one or more implementations, the signal generator 104 comprises an oscillator configured to generate a sine wave, digital-to-analog circuitry, an arbitrary waveform generator, or the like.

The expected signal generator module 106 provides functionality for generating an expected output signal (e.g., an expected ADC output code) corresponding to the input signal. In some implementations, as shown in FIG. 1, the expected signal generator module 106 receives the input signal from the signal generator 104 at an input 107-1 and outputs an expected ADC output code at output 107-2. The expected signal generator module 106 also may include data representing an actual ADC output code corresponding to the analog-to-digital converter circuitry 102 to be tested. For example, the expected signal generator module 106 may be pre-programmed with data representing the actual ADC output code. The expected signal generator module 106 generates an expected ADC output code based upon the input signal and the corresponding actual ADC output code. For example, the expected signal generator module 106 may produce a sequence of output codes representing a digital linear ramp signal that is expected at the output of an ideal linear ADC when the input signal generator generates a linear analog ramp signal. In another example, when the input signal generator generates a sine wave signal, the expected signal generator module may produce a sequence of output codes representing a digital pure sine wave that is expected at the output of a linear ADC. In yet another example, the expected signal generator may take the actual ADC output data corresponding to a sine wave input signal, extract the total sine wave component out of such output data based upon digital signal processing techniques, and present the extracted sine wave as its output. In yet another example, the expected signal generator may take the actual ADC output data corresponding to an analog linear ramp input signal, extract a linear fit line out of the ADC output data using linear regression or least square method, and present the extracted linear fit line as its output.

The error signal module 108 provides functionality for comparing the output code generated by the analog-to-digital converter circuitry 102 and the expected ADC output code and generating an error signal based upon the difference between the output code and the expected output code. For example, the error signal module 108 may generate an actual output code error signal by subtracting the output code from the expected output code. The output code error signal may reflect the error associated with the analog-to-digital converter circuitry 102. For example, the error signal may represent error to nonlinearity, noise, quantization, or the like.

As shown in FIG. 1, the system 100 includes a nonlinearity modeling module 110 that provides ADC nonlinearity modeling functionality. The nonlinearity modeling module 110 receives at an input 111-1 code corresponding to a possible ADC output code. Based upon the code received at the input 111-1, the nonlinearity modeling module 110 generates a predicted (e.g., modeled) nonlinearity signal at an output 111-2 representing a predicted nonlinearity value for the analog-to-digital converter circuitry 102 associated with code at the input 111-1. For example, the predicted nonlinearity signal may comprise a predicted integral non-linearity (INL) value, a differential non-linearity (DNL) value, or the like. For example, the nonlinearity modeling module 110 may generate a predicted nonlinearity value utilizing an identification process, such as a total sum of mismatch squares. In one or more implementations, the nonlinearity modeling module 110 generates predicted nonlinearity signals representing an analog-to-digital converter's INL curve.

The predicted nonlinearity value for a particular code is provided a second error signal module 112. As shown in FIG. 1, the second error signal module 112 receives the output code error signal from the error signal module 108 and the predicted nonlinearity signal from the nonlinearity modeling module 110. The second error signal module 112 utilizes the output code error signal and the predicted nonlinearity signal corresponding to a respective code of the analog-to-digital converter circuitry 102 to generate an error signal corresponding to the respective code. As discussed herein, the error signal is utilized to construct respective nonlinearity values (e.g., INL(k) curves) for respective codes (e.g., code k=0, 1, . . . , $2^N-1$). In one or more implementations, the code's total nonlinearity signal may comprise the sum of a major segment (e.g., portion), a middle segment (e.g., portion), and a tail segment (e.g., portion). For example, the module 108 may divide the entire INL(k) curve into a number of major segments according to the segmented nature of the ADC circuitry. The major segments may be numbered based upon the values of the most significant bits in the ADC codes. The module 108 may further divide each major segment into a number of middle segments based upon the values of the middle bits of the ADC codes. Within each middle segment, the INL(k) values are numbered based upon the values of the least significant tail bits in the ADC codes. For each possible code from the ADC, the module 108 classify the code into a respective major segment, a middle segment, and a tail segment, based upon the values of the most significant bits, the middle bits, and the least significant tail bits. Thus, a code's total nonlinearity error is modeled as the sum of the major segment errors, middle segment errors, and tail segment errors. In an implementation, the major segments are separated based upon most-significant bit codes (e.g., grouped by MSB codes). The error segments may be separated (e.g., grouped) utilizing one or more suitable code grouping processes.

Figure 2:
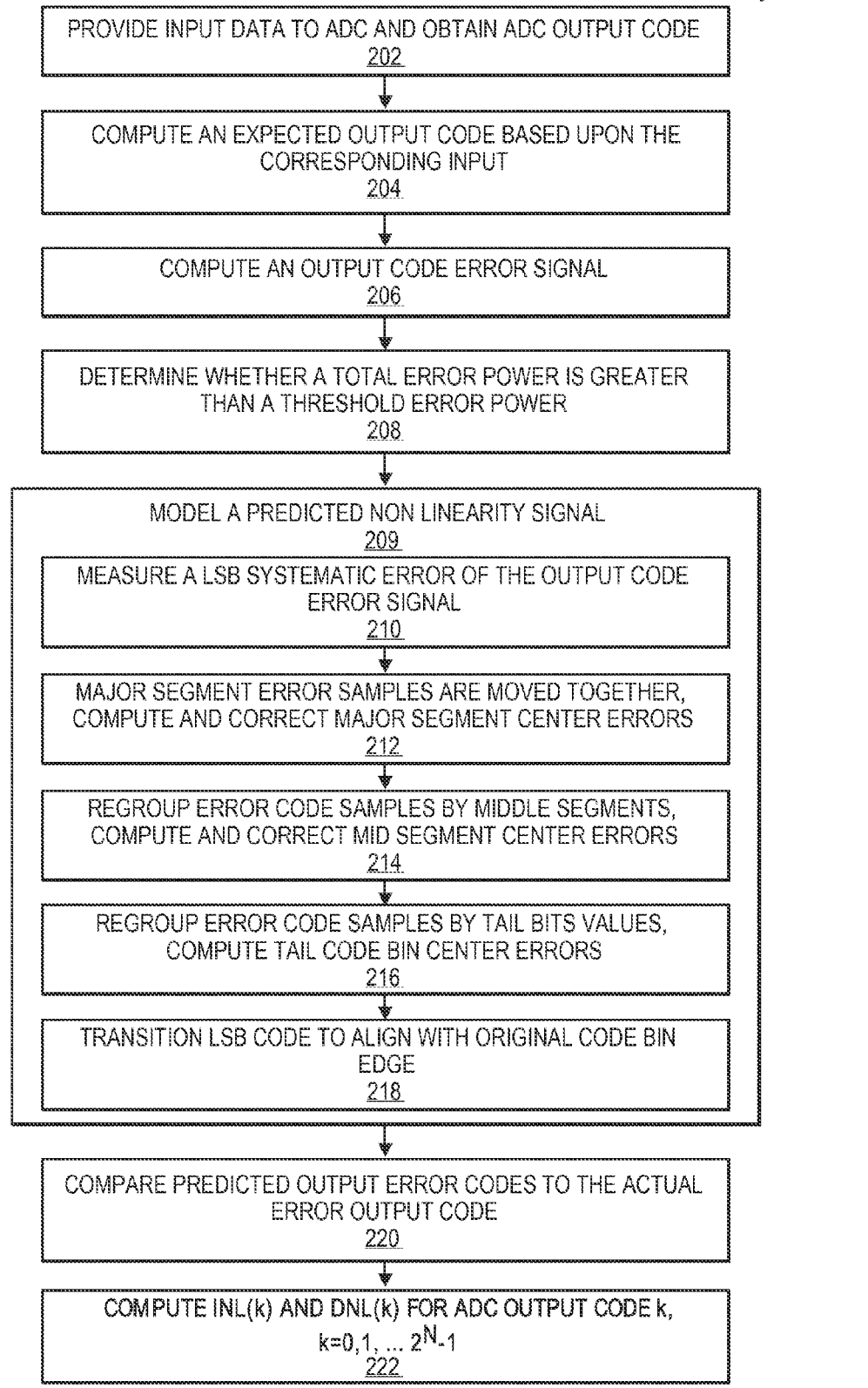
FIG. 2 is a flow diagram for providing a linearity test to an analog-to-digital converter in accordance with an example implementation of the present disclosure.

FIG. 2 illustrates a method 200 for performing a linearity test on an analog-to-digital converter. As shown in FIG. 2, input data is provided to analog-to-digital converter circuitry (Block 202). As described above, input data is provided to the circuitry 102 from a signal generator 104. The circuitry 102 generates output code data corresponding to the input data as described above. As shown in FIG. 2, an expected output code data is computed based upon the corresponding input (Block 204). For example, the expected signal generator module 106 generates an expected output code corresponding to the respective input signal. An output code error signal is computed (Block 206) as shown in FIG. 2. In one or more implementations, an output code error signal is computed by the error signal module 108. The module 108 is configured to determine whether a total error power is greater than a threshold error power. If the total error power is greater than a threshold error power, the linearity test is terminated (Block 208). For example, the module 108 determines whether the total error power associated with the output code error signal is greater than a predefined threshold error power. If the total error power is greater than the predefined threshold error power, the testing of the analog-to-digital converter circuitry 102 is terminated.

Figure 3:
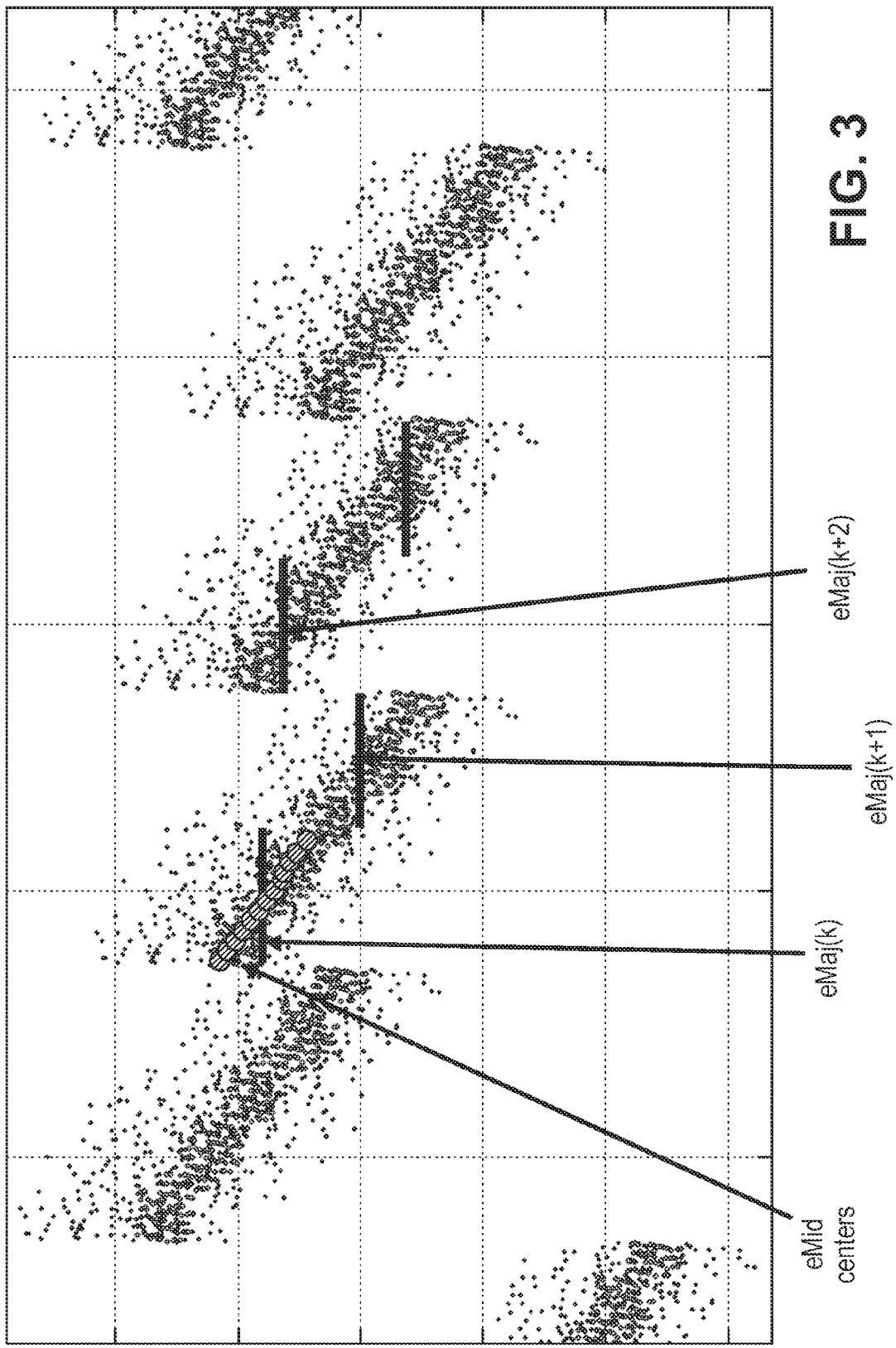
FIG. 3 is a diagrammatic illustration of a segmented non-parametric model modeling the analog-to-digital integral non-linearity errors in the testing system shown in FIG. 1.

As described in greater detail herein, a predicted nonlinearity signal (e.g., curve) is modeled (Block 209). A suitable histogram process is utilized to measure least significant bit (LSB) systematic errors of the output code error signal (Block 210). In one or more implementations, a nonlinearity modeling module 110 (shown in FIG. 1) utilizes a local histogram test process to measure the least significant bit systematic errors. The nonlinearity modeling module 110 represents functionality to measure and compute code bin center errors based upon the respective code's major segment, middle segment, and tail segment. In an implementation, once the nonlinearity modeling module 110 measures the LSB systematic errors, the respective LSB bin centers are moved to an ideal location to remove a LSB code bin width error. For example, for output codes that has a LSB code that equals k, the ADC output code is subtracted by eLSB(k), where eLSB(k) represents the LSB systematic code center error corresponding to code k and eLSB(k) comprises a code bin edge error inlLSB(k) and code bin width error dnlLSB(k). This may shift the average value of respective samples in this bin to an ideal location. As shown in FIG. 2, respective samples (e.g., output code errors) associated with codes belong to the respective major segment are moved together (Block 212) to compute and correct the major segment center errors. For example, the nonlinearity modeling module 110 computes and corrects respective major segment center errors. For instance, respective major segments have a corresponding center and/or average errors, as shown in FIG. 3. For respective segments of the major segment center errors, the module 114 computes the value at the center of the segment. For example, if the output code errors are sorted by the associated output codes, a loop can be executed to loop through the major segment according to the most significant bits value equal to 0 to $2^{Maj}-1$. The samples are moved to the center value and the major segment center error is estimated as the sample mean. For example, the error of the major segments can be modeled as eMaj(k)=sum (code errors corresponding to codes with major bits=k)/(number of samples in k-th major segment). In some instances, the major segment center error is estimated as the minimum variance estimate. The module 114 may compute (e.g., capture) the nonlinearities of the ADC transfer curve at the center of respective MSB segments.

The code error samples are then regrouped by middle segments (Block 214) to compute and correct middle segment center errors. For example, each middle segment of respective code error samples may include center and/or average errors, and the nonlinearity modeling module 110 regroups the code error samples by middle segments. Upon regrouping, the nonlinearity modeling module 110 computes and corrects the middle segment center errors. For example, for respective MSB segments, the module 114 subtracts all code errors by the MSB segment center value, and the MSB nonlinearities are at least substantially removed. Each MSB segment is further segmented into $2^{Mid}$ number of middle segments. Within respective mid segments k, the module 114 transitions all code error samples to the center of the middle segments. These samples are then utilized to estimate the eMid(k) by taking the sample mean of the respective samples. For example, the error of the middle segments can be modeled as eMid(k)=sum (code errors corresponding to codes with middle bits=k)/(number of samples in $k^{th}$ middle segment).

As shown in FIG. 2, the code error samples are then regrouped by tail segments (Block 216) to compute and correct the tail segment center errors. For example, each tail segment of respective code error samples may include center and/or average errors, and the nonlinearity modeling module 110 regroups the code error samples by tail segments (e.g., according to the tail bits values of the associated codes). Upon regrouping, the nonlinearity modeling module 110 computes and corrects the tail segment center errors. For example, the eMid (error of the middle segment) is subtracted from respective code errors in the corresponding mid segment. For each value of k equal to 0 to $2^{Tail}-1$, the error of the tail segment is computed by taking the mean of all the updated code errors that have a corresponding ADC output code having the last tail bits value that is equal to k. For example, the error of the k-th tail segment can be modeled by eTail(k)=sum (code errors corresponding to ADC tail bids=k)/(number of samples in the k-th tail segment).

Upon computing the major segment center errors, the middle segment center errors and the tail segment center errors, the nonlinearity modeling module computes the predicted nonlinearity errors for possible ADC output code. For example, for respective ADC output code C in the range of 0 to $2^N-1$, the major bits of C have a value C_maj, the middle bits of C have a value C_mid, the tail bits of C have a value C_tail, and the LSB bits of C have a value C_LSB. The integral nonlinearity (INL) of the ADC at output code C can be modeled by INL(C)=eMaj(C_maj)+eMid(C_mid)+eTail(C_Tail).

The INL(C) is computed until the above corresponds to the predicted INL for the ADC after the LSB systematic errors have been corrected. To predict the INL of the original uncorrected ADC, the LSB code center is transitioned (e.g., transitioned back) by the amount of the center move earlier corresponding to the LSB code bin edge errors inlLSB(k) (Block 218). In an implementation, the nonlinearity modeling module 110 computes the LSB code bin center errors for respective codes. The nonlinearity modeling module 110 also moves LSB code bin centers to the original locations. For example, the LSB code bin centers can be moved back by modifying the computed INL by INL(C)=INL(C)+lsbINL(C_LSB).

The predicted output errors are compared to the actual output code errors (Block 220). In an implementation, the module 112 compares the predicted output error with the actual output code error signal. For example, the module 112 may also model end point fit lines to compare to the actual output code error signal generated by the analog-to-digital converter circuitry 102. For instance, module 112 may apply the modeled (e.g., predicted) nonlinearity values (e.g., curve) to the generated (e.g., actual) error signal (e.g., actual error curve). For example, the module 114 may compare a modeled INL curve (e.g., modeled by the nonlinearity modeling module 110) to the actual output error generated by the error signal module 108. Based upon this difference, the module 114 may determine whether the circuitry 102 meets one or more specifications (e.g., whether the circuitry outputs an output code that meets the specifications). In an implementation, the variance of this difference in each major segment can be computed and abnormal behaviors in the variance can be used as an indication of excess dynamic errors in the analog-to-digital convertor circuitry. As shown in FIG. 2, the INL(k) and DNL(k) for respective ADC output k (where k=0, 1, ... $2^N-1$) is computed (Block 222). For example, upon computing the integral nonlinearity (INL(C)), the sequential difference can be computed diff(C)=INL(C+1)−INL(C), which can be utilized to calculate DNL values (e.g., DNL(C)=diff(C)−mean(diff(C)). Based upon this modeling the magnitude of the ADC errors can be used to detect sparkle codes, excursion samples, settling problems in signal sources, underperforming converters, and so forth. The magnitude of the residual errors can be used to detect quality of INL/DNL results, code issues that may require additional testing, and so forth.

Generally, any of the functions described herein can be implemented using hardware (e.g., fixed logic circuitry such as integrated circuits), software, firmware, manual processing, or a combination of these embodiments. Thus, the blocks discussed in the above disclosure generally represent hardware (e.g., fixed logic circuitry such as integrated circuits), software, firmware, or a combination thereof. In the instance of a hardware embodiment, for instance, the various blocks discussed in the above disclosure may be implemented as integrated circuits along with other functionality. Such integrated circuits may include all of the functions of a given block, system or circuit, or a portion of the functions of the block, system or circuit. Further, elements of the blocks, systems or circuits may be implemented across multiple integrated circuits. Such integrated circuits may comprise various integrated circuits including, but not necessarily limited to: a monolithic integrated circuit, a flip chip integrated circuit, a multichip module integrated circuit, and/or a mixed signal integrated circuit. In the instance of a software embodiment, for instance, the various blocks discussed in the above disclosure represent executable instructions (e.g., program code) that perform specified tasks when executed on a processor. These executable instructions can be stored in one or more tangible computer readable media. In some such instances, the entire system, block or circuit may be implemented using its software or firmware equivalent. In other instances, one part of a given system, block or circuit may be implemented in software or firmware, while other parts are implemented in hardware.

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A system comprising:
  a signal generator for generating an input signal;
  analog-to-digital converter circuitry communicatively coupled to the signal generator, the analog-to-digital converter circuitry generating an output code based upon the input signal;
  an expected signal generator module communicatively coupled to the signal generator and to the analog-to-digital converter circuitry, the expected signal generator module for generating an expected output code based upon the analog input signal;
  an output code error signal module communicatively coupled to the output of the analog-to-digital converter circuitry and to the output of the expected signal generator module, the error signal module for generating an output code error signal representing a difference between the output code and corresponding expected output code;
  a nonlinearity modeling module communicatively coupled to the output code error signal module, the nonlinearity module for modeling a predicted nonlinearity value based upon the output code; and
  a nonlinearity error signal module communicatively coupled to the output code error signal module and the nonlinearity modeling module, the nonlinearity error signal module for generating a nonlinearity error value representing a difference between the output code error signal and the corresponding predicted nonlinearity value.

2. The system as recited in claim 1, wherein the input signal comprises a sine wave input signal.

3. The system as recited in claim 1, wherein the input signal comprises a linear ramp signal.

4. The system as recited in claim 1, wherein the nonlinearity error signal module compares the nonlinearity error value to the predicted error value.

5. A method comprising:
  providing input data to analog-to-digital converter circuitry, the analog-to-digital converter circuitry configured to generate an output code based upon the input data;
  generating expected output code based upon the corresponding input data;
  generating an output code error signal based upon the difference of the output code and the expected output code;
  modeling a predicted code error signal based upon corresponding code; and
  generating a nonlinearity error signal representing a difference between the output code error signal and the predicted nonlinearity.

6. The method as recited in claim 5, wherein the input signal comprises a sine wave input signal.

7. The method as recited in claim 5, wherein the input signal comprises a linear ramp signal.

8. The method as recited in claim 5, further comprising comparing the nonlinearity error value to the predicted error value.

* * * * *